(12) United States Patent
Kong et al.

(10) Patent No.: US 10,302,828 B2
(45) Date of Patent: May 28, 2019

(54) OPTICAL FILM AND DISPLAY DEVICE

(71) Applicants: SAMSUNG ELECTRONICS CO., LTD., Suwon-si, Gyeonggi-do (KR); SAMSUNG SDI CO., LTD., Yongin-si, Gyeonggi-do (KR)

(72) Inventors: Hye Young Kong, Uijeongbu-si (KR); Jong Hoon Won, Yongin-si (KR); Seung Jun Lee, Suwon-si (KR); Sangah Gam, Seoul (KR); Hyung Jun Kim, Suwon-si (KR); Myung-Sup Jung, Seongnam-si (KR); Woo Jin Jeong, Suwon-si (KR); Hyun-Seok Cho, Seoul (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 74 days.

(21) Appl. No.: 14/989,197

(22) Filed: Jan. 6, 2016

(65) Prior Publication Data

US 2017/0031074 A1    Feb. 2, 2017

(30) Foreign Application Priority Data

Jul. 27, 2015  (KR) .................. 10-2015-0105720
Dec. 21, 2015  (KR) .................. 10-2015-0183008

(51) Int. Cl.
*G02F 1/1335*    (2006.01)
*G02B 5/30*    (2006.01)
(Continued)

(52) U.S. Cl.
CPC ......... *G02B 5/3016* (2013.01); *G02B 5/3025* (2013.01); *G02B 5/3083* (2013.01);
(Continued)

(58) Field of Classification Search
CPC ................................................. G02F 1/133528
See application file for complete search history.

(56) References Cited

U.S. PATENT DOCUMENTS 6,074,729 A    6/2000  Watanabe et al.
2008/0102228 A1    5/2008  Kim et al.
(Continued)

FOREIGN PATENT DOCUMENTS

| CN | 101168649 | 4/2008 |
| KR | 1020080037906 | 5/2008 |
| KR | 1020080052633 | 6/2008 |
| KR | 101070481 | 9/2011 |

*Primary Examiner* — Edmond C Lau
(74) *Attorney, Agent, or Firm* — Cantor Colburn LLP

(57) ABSTRACT

An optical film includes a polarization film including a polyolefin and a dichroic dye, a first phase delay layer positioned on one side of the polarization film and including a liquid crystal, a second phase delay layer positioned on one side of the first phase delay layer and including a liquid crystal, a first adhesive between the polarization film and the first phase delay layer, and a second adhesive between the first phase delay layer and the second phase delay layer, wherein at least one of the first adhesive and the second adhesive has a room temperature storage modulus of greater than or equal to about 0.2 MPa at a frequency of 10 Hz, and a display device including the same, are provided.

15 Claims, 9 Drawing Sheets

(51) Int. Cl.
　　　*G02F 1/13363*　　(2006.01)
　　　*H01L 51/52*　　　(2006.01)
　　　*H01L 27/32*　　　(2006.01)

(52) U.S. Cl.
　　　CPC .... G02F 1/133528 (2013.01); *G02F 1/13363* (2013.01); *G02F 2202/28* (2013.01); *H01L 27/32* (2013.01); *H01L 51/5262* (2013.01); *H01L 51/5281* (2013.01)

(56) References Cited

U.S. PATENT DOCUMENTS

| | | | |
|---|---|---|---|
| 2009/0191362 A1 | 7/2009 | Tanaka et al. | |
| 2011/0181814 A1* | 7/2011 | Sakai | G02B 5/3016 |
| | | | 349/96 |
| 2013/0301129 A1* | 11/2013 | In | G02B 5/3083 |
| | | | 359/492.01 |
| 2014/0130955 A1* | 5/2014 | Yasui | G02B 5/3025 |
| | | | 156/60 |
| 2014/0186554 A1 | 7/2014 | Jung et al. | |
| 2014/0306941 A1* | 10/2014 | Kim | H04M 1/0268 |
| | | | 345/204 |
| 2015/0079387 A1 | 3/2015 | Yang et al. | |
| 2015/0131031 A1* | 5/2015 | Kim | G02B 5/3016 |
| | | | 349/75 |
| 2015/0131032 A1* | 5/2015 | Kim | G02B 5/3016 |
| | | | 349/75 |
| 2015/0293407 A1* | 10/2015 | Iida | G02F 1/133634 |
| | | | 349/96 |

\* cited by examiner

OPTICAL FILM AND DISPLAY DEVICE

CROSS-REFERENCE TO RELATED APPLICATION

This application claims priority to and the benefit of Korean Patent Application Nos. 10-2015-0105720 and 10-2015-0183008 filed in the Korean Intellectual Property Office on Jul. 27, 2015 and Dec. 21, 2015, and all the benefits accruing therefrom under 35 U.S.C. § 119, the entire contents of which are incorporated herein by reference.

BACKGROUND

1. Field

An optical film and a display device are disclosed.

2. Description of the Related Art

Commonly used flat panel displays may be classified into light-emitting display devices emitting light by themselves and a non-emissive display devices requiring a separate light source. A compensation film such as a retardation film is frequently employed for improving the image quality thereof.

In the case of the light emitting display device, for example, an organic light emitting diode display, the visibility and the contrast ratio may be deteriorated by reflection of exterior light caused by a metal such as an electrode. In order to reduce this, the linear polarized light is changed into circularly polarized light by using a polarizer and a compensation film, so that reflection of the external light by the organic light emitting diode display and leakage thereof to the outside may be prevented.

As a solution for solving the external light reflection, the liquid crystal display, which is a non-emissive display device, changes linear polarized light into circularly polarized light to improve the image quality according to the device kind such as transparent, transflective, reflective, and so on.

However, a currently-developed optical film has weak durability and may have an influence on quality of a display device, and particularly, cause damage at a place where it is bent or folded. In addition, the optical film itself is thick and hinders the manufacture of a thinner display device.

SUMMARY

Disclosed herein is an optical film having a thin thickness and improved durability.

Also disclosed herein is a display device including the optical film.

According to an embodiment, an optical film includes a polarization film including a polyolefin and a dichroic dye, a first phase delay layer positioned on the polarization film and including a liquid crystal, a second phase delay layer positioned on the first phase delay layer and including a liquid crystal, a first adhesive between the polarization film and the first phase delay layer, and a second adhesive between the first phase delay layer and the second phase delay layer, wherein at least one of the first adhesive and the second adhesive has a room temperature storage modulus of greater than or equal to about 0.2 megaPascals (MPa) at a frequency of 10 Hertz (Hz).

The adhesive may include a (meth)acryl compound, a urethane compound, a polyisobutylene compound, a styrene butadiene rubber, a polyvinylether compound, an epoxy compound, a melamine compound, a polyester compound, a phenol compound, a silicon compound, a derivative thereof, a copolymer thereof, or a combination comprising at least one of the foregoing comprising at least one of the foregoing.

The adhesive may include a resin having a hydroxy group, a carboxyl group, a nitrogen-containing functional group, or a combination comprising at least one of the foregoing.

The adhesive may be a cross-linked resin cross-linked by a cross-linking agent of an isocyanate compound, an epoxy compound, an aziridine compound, a metal chelate compound, or a combination comprising at least one of the foregoing.

The first phase delay layer and the second phase delay layer may be thinner than the first adhesive or the second adhesive, respectively.

Each thickness of the first phase delay layer and the second phase delay layer may be about 0.05 to about 0.8 times a thickness of the first adhesive or the second adhesive.

Each thickness of the first adhesive and the second adhesive may be about 5 micrometers (μm) to about 25 μm, and each thickness of the first phase delay layer and the second phase delay layer may be about 0.5 μm to about 5 μm.

The sum of the thicknesses of the first phase delay layer and the second phase delay layer may be about 1 μm to about 10 μm.

At least one of the first adhesive and the second adhesive may have a room temperature storage modulus of about 0.2 megaPascals (MPa) to about 8 gigaPascals (GPa) at a frequency of 10 Hz.

At least one of the first adhesive and the second adhesive may have a 90° peel force of greater than or equal to about 1500 grams force per 25 millimeters (gf/25 mm) at room temperature for the first phase delay layer or the second phase delay layer.

One of the first phase delay layer and the second phase delay layer may have in-phase retardation of about 230 nanometers (nm) to about 300 nm for a 550 nm wavelength, and the other of the first phase delay layer and the second phase delay layer may have in-phase retardation of about 110 nm to about 160 nm for a 550 nm wavelength.

The liquid crystal of the first phase delay layer and the liquid crystal of the second phase delay layer may have respective refractive indices satisfying Relationship Equation 1A or 1B.

$$n_x > n_y = n_z \quad \text{Relationship Equation 1A:}$$

$$n_x < n_y = n_z \quad \text{Relationship Equation 1B:}$$

In Relationship Equations 1A and 1B, $n_x$ is a refractive index at a slow axis of the first phase delay layer and the second phase delay layer, $n_y$ is a refractive index at a fast axis of the first phase delay layer and the second phase delay layer, and $n_z$ is a refractive index in the direction perpendicular to $n_x$ and $n_y$.

In-phase retardation ($R_{e1}$) of the first phase delay layer for 450 nm, 550 nm, and 650 nm wavelengths may satisfy $R_{e1}$ (450 nm)>$R_{e1}$ (550 nm)>$R_{e1}$ (650 nm), in-phase retardation ($R_{e2}$) of the second phase delay layer for 450 nm, 550 nm, and 650 nm wavelengths may satisfy $R_{e2}$ (450 nm)>$R_{e2}$ (550 nm)>$R_{e2}$ (650 nm), and entire in-phase retardation ($R_{e0}$) of the first phase delay layer and the second phase delay layer for 450 nm, 550 nm, and 650 nm wavelengths may satisfy $R_{e0}$ (450 nm)≤$R_{e0}$ (550 nm)<$R_{e0}$ (650 nm) or $R_{e0}$ (450 nm)<$R_{e0}$ (550 nm)≤$R_{e0}$ (650 nm).

The first phase delay layer and the second phase delay layer may respectively have short wavelength dispersion of about 1.1 to about 1.2, and the first phase delay layer and the second phase delay layer may have entire short wavelength dispersion of about 0.70 to about 0.99.

The first phase delay layer and the second phase delay layer may respectively have long wavelength dispersion of about 0.9 to about 1.0, and the first phase delay layer and the second phase delay layer may have entire long wavelength dispersion of about 1.01 to about 1.20.

The polarization film may have a thickness of less than or equal to about 100 µm.

Also disclosed herein is a display device including a display panel and an optical film positioned on at least one side the display panel is provided.

The display panel may include a liquid crystal panel or an organic light emitting panel.

The display panel may be a flexible display panel.

BRIEF DESCRIPTION OF THE DRAWINGS

The above and other aspects, advantages and features will become more apparent by describing in further detail exemplary embodiments thereof with reference to the accompanying drawings in which.

DETAILED DESCRIPTION

Figure 1:
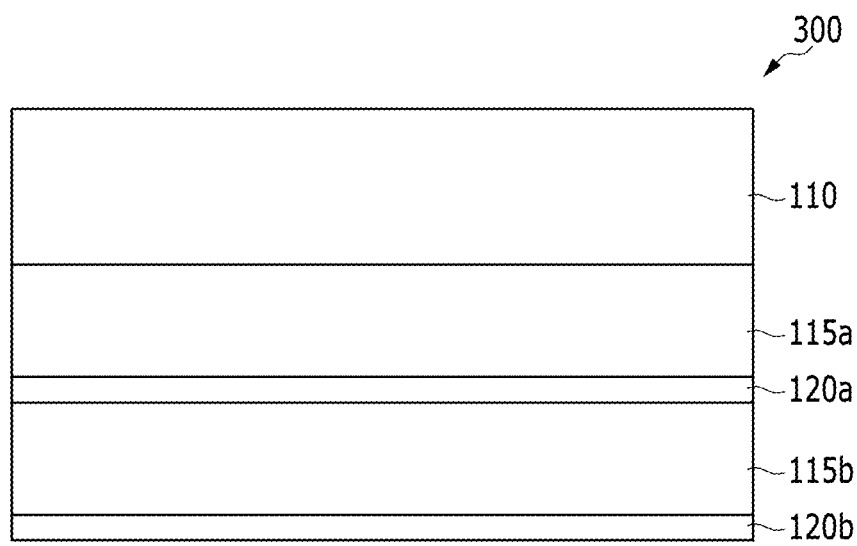
FIG. 1 is a schematic cross-sectional view showing an exemplary example of an optical film according to one embodiment.

Exemplary embodiments of the present invention will hereinafter be described in detail, and may be easily performed by those who have common knowledge in the related art. However, this disclosure may be embodied in many different forms, and is not to be construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

Hereinafter, an optical film according to an exemplary embodiment is described referring to the drawings.

FIG. 1 is a schematic cross-sectional view showing an optical film according to an exemplary embodiment.

Referring to FIG. 1, an optical film 300 includes a polarization film 110, a first phase delay layer 120a, a second phase delay layer 120b, a first adhesive 115a between the polarization film 110 and the first phase delay layer 120a, and a second adhesive 115b between the first phase delay layer 120a and the second phase delay layer 120b.

The first phase delay layer 120a and the second phase delay layer 120b may have different in-phase retardation from each other. For example one of the first phase delay layer 120a and the second phase delay layer 120b may have in-phase retardation of about 230 nm to about 300 nm and the other may have in-phase retardation of about 110 nm to about 160 nm for a 550 nm wavelength (hereinafter referred to as 'reference wavelength'). For example, in-phase retardation of the first phase delay layer 120a for the reference wavelength may be about 230 nm to about 300 nm and in-phase retardation of the second phase delay layer 120b for the reference wavelength may be about 110 nm to about 160 nm.

For example, one of the first phase delay layer 120a and the second phase delay layer 120b may be a $\lambda/2$ phase delay layer and the other may be a $\lambda/4$ phase delay layer. For example, the first phase delay layer 120a may be a $\lambda/2$ phase delay layer and the second phase delay layer 120b may be a $\lambda/4$ phase delay layer.

The first phase delay layer 120a and the second phase delay layer 120b may circularly-polarize light having passed through the polarization film 110 to generate phase difference, and may influence reflection and/or absorption of light.

For example, the optical film 300 may be disposed on one side or both sides of a display device, and particularly on the screen side of the display device, and thus may prevent reflection of light flowing in from the outside (hereinafter referred to as "external light"). Therefore, the optical film 300 may prevent visibility deterioration due to the reflection of external light.

Figure 2:
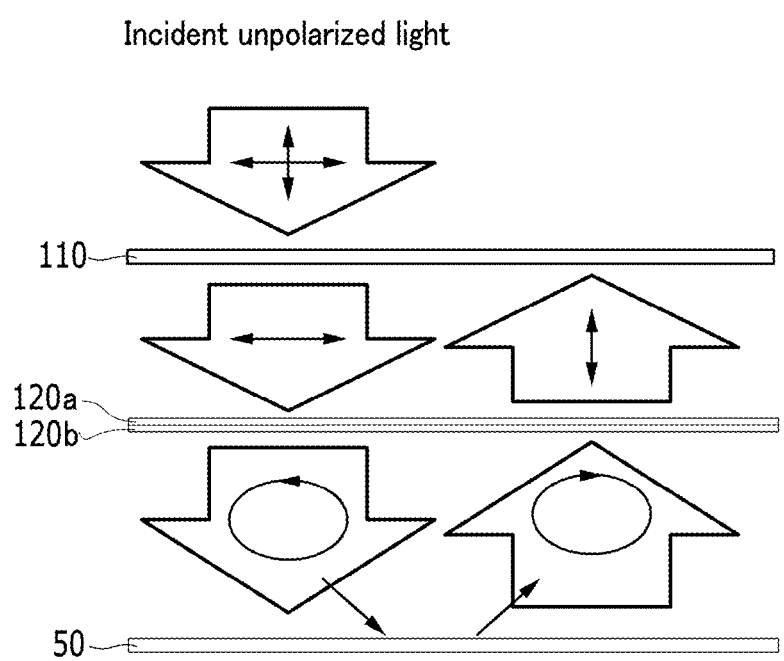
FIG. 2 is a schematic view showing the anti-reflection principle of an exemplary embodiment of an optical film.

FIG. 2 is a schematic view showing the external light anti-reflection principle of an optical film.

Referring to FIG. 2, while the incident unpolarized light having entered from the outside is passed through the polarization film 110, and the polarized light is shifted into circularly polarized light by passing through the first phase delay layer 120a and the second phase delay layer 120b, only a first polarized perpendicular component, which is one polarized perpendicular component of two polarized perpendicular components, is transmitted. While the circularly polarized light is reflected in a display panel 50 including a substrate, an electrode, and so on, and changes the circular polarization direction, and the circularly polarized light is passed through the second phase delay layer 120b and the first phase delay layer 120a again, only a second polarized perpendicular component, which is the other polarized perpendicular component of the two polarized perpendicular components, may be transmitted. As the second polarized perpendicular component is not passed through the polarization film 110, and light does not exit to the outside, effects of preventing the external light reflection may be provided.

Figure 3:
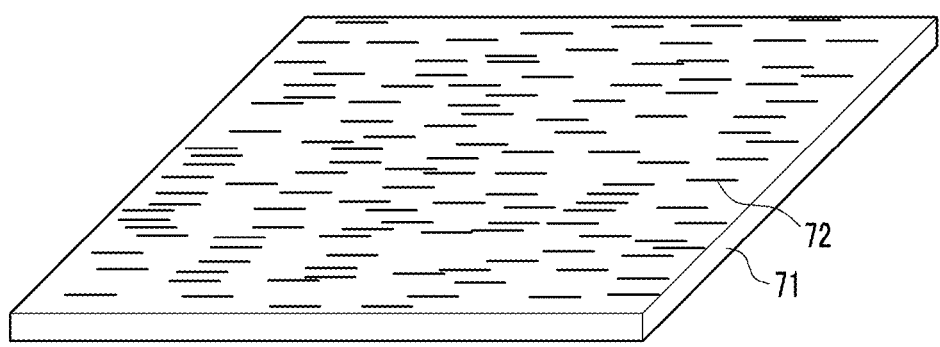
FIG. 3 is a schematic cross-sectional view showing a polarization film in the optical film of FIG. 1.

FIG. 3 is a cross-sectional schematic view showing a polarization film in the optical film of FIG. 1.

Referring to FIG. 3, the polarization film 110 may be an elongation film made of a melt blend of a polyolefin 71 and a dichroic dye 72.

The polyolefin 71 may be, for example, polyethylene (PE), polypropylene (PP), a copolymer of polyethylene and polypropylene (PE-PP), or a combination comprising at least one of the foregoing. For another example, the polyolefin 71 may be a mixture of polypropylene (PP) and a polyethylene-polypropylene copolymer (PE-PP).

The polypropylene (PP) may have, for example, a melt flow index (MFI) of about 0.1 grams per 10 minutes (g/10 min) to about 5 g/10 min. As used herein, the melt flow index (MFI) shows the amount of a polymer in a melt state flowing per 10 min, and relates to viscosity of the polyolefin in a molten state. In other words, as the melt flow index (MFI) is lower, the polyolefin has higher viscosity, while as the melt flow index (MFI) is higher, the polyolefin has lower viscosity. When the polypropylene (PP) has a melt flow index (MFI) within the above described range, properties of a final product as well as workability may be effectively improved. Specifically, the polypropylene may have a melt flow index (MFI) ranging from about 0.5 g/10 min to about 5 g/10 min.

The polyethylene-polypropylene copolymer (PE-PP) may include about 1 wt % to about 50 wt % of an ethylene group based on the total amount of the copolymer. When the polyethylene-polypropylene copolymer (PE-PP) includes an amount of the ethylene group within this range, phase separation of the polypropylene and the polyethylene-polypropylene copolymer (PE-PP) may be effectively prevented or suppressed. In addition, the polyethylene-polypropylene copolymer (PE-PP) may improve an elongation rate during elongation as well as have excellent light transmittance and alignment, improving polarization characteristics. Specifically, the polyethylene-polypropylene copolymer (PE-PP) may include an ethylene group in an amount of about 1 wt % to about 25 wt % based on the total amount of the copolymer.

The polyethylene-polypropylene copolymer (PE-PP) may have a melt flow index (MFI) ranging from about 5 g/10 min to about 15 g/10 min. When the polyethylene-polypropylene copolymer (PE-PP) has a melt flow index (MFI) within the range, properties of a final product as well as workability may be effectively improved. Specifically, the polyethylene-polypropylene copolymer (PE-PP) may have a melt flow index (MFI) ranging from about 10 g/10 min to about 15 g/10 min.

The polyolefin 71 may include a polypropylene (PP) and polyethylene-polypropylene copolymer (PE-PP) in a weight ratio of about 1:9 to about 9:1. When the polypropylene (PP) and the polyethylene-polypropylene copolymer (PE-PP) are included within this range, the polypropylene may be prevented from crystallizing and may have excellent mechanical strength, thus effectively improving the haze characteristics. Specifically, the polyolefin 71 may include the polypropylene (PP) and the polyethylene-polypropylene copolymer (PE-PP) in a weight ratio of about 4:6 to about 6:4, and specifically, in a weight ratio of about 5:5.

The polyolefin 71 may have a melt flow index (MFI) ranging from about 1 g/10 min to about 15 g/10 min. When the polyolefin 71 has a melt flow index (MFI) within this range, the polyolefin resin may not only secure excellent light transmittance since crystals are not excessively formed in the resin, but may also have appropriate viscosity for manufacturing a film and thus have improved workability. Specifically, the polyolefin 71 may have a melt flow index (MFI) ranging from about 5 g/10 min to about 15 g/10 min.

The polyolefin 71 may have haze ranging from less than or equal to about 5%. When the polyolefin 71 has haze within this range, transmittance may be increased, and thus excellent optical properties may be secured. Specifically, the polyolefin 71 may have haze of less than or equal to about 2%, and more specifically, about 0.5% to about 2%.

The polyolefin 71 may have crystallinity of less than or equal to about 50%. When the polyolefin 71 has crystallinity within this range, the polyolefin resin may have lower haze and accomplish excellent optical properties. For example, the polyolefin 71 may have crystallinity of about 30% to about 50%.

The polyolefin 71 may have transmittance of greater than or equal to about 85% in a wavelength region of about 400 to about 780 nm. The polyolefin 71 may be elongated in a uniaxial direction. The direction may be the length direction of the dichroic dye 72.

The dichroic dye 72 is dispersed in the polyolefin 71 and aligned in the elongation direction of the polyolefin 71. The dichroic dye 72 transmits one perpendicular polarization component out of two perpendicular polarization components in a predetermined wavelength region.

The dichroic dye 72 may be included in an amount of about 0.01 to about 5 parts by weight based on 100 parts by weight of the polyolefin 71. Within this range, sufficient polarization characteristics may be obtained without deteriorating transmittance of a polarization film. Within the above range, the dichroic dye 72 may be included in an amount of about 0.05 to about 1 part by weight based on 100 parts by weight of the polyolefin 71.

The polarization film 110 may have a dichroic ratio of about 2 to about 14 at a maximum absorption wavelength ($\lambda_{max}$) in a visible ray region. Within the range, the dichroic ratio may be about 3 to about 10. Herein, the dichroic ratio is a value obtained by dividing linear polarization absorption in a direction perpendicular to the axis of the polymer by polarization absorption in a direction parallel to the polymer, and may be obtained by Equation 1.

$$DR = Log(1/T_\perp)/Log(1/T_{//}) \qquad \text{[Equation 1]}$$

In Equation 1,

DR is a dichroic ratio of a polarization film, $T_{//}$ is light transmittance of light entering parallel to the transmissive axis of a polarization film, and $T_\perp$ is light transmittance of light entering perpendicular to the transmissive axis of the polarization film.

The dichroic ratio denotes a degree that the dichroic dye 72 is aligned in one direction in the polarization film 110. The polarization film 110 has a dichroic ratio within the range in a visible ray wavelength region, which leads the dichroic dye 72 to be aligned along the alignment of a polyolefin chain, and thus may improve the polarizing characteristics.

The polarization film 110 may have polarization efficiency of greater than or equal to about 80%, and within the range, about 83 to about 99.9%. Herein, the polarization efficiency may be obtained by Equation 2.

$$PE\ (\%) = [(T_{//} - T_\perp)/(T_{//} + T_\perp)]^{1/2} * 100 \qquad \text{[Equation 2]}$$

In Equation 2,

PE is polarization efficiency, $T_{||}$ is light transmittance of the polarization film regarding light parallel to the transmissive axis of the polarization film, and $T_\perp$ is light transmittance of the polarization film regarding light perpendicular to the transmissive axis of the polarization film.

The polarization film 110 may have a relatively thin thickness of less than or equal to about 100 μm, for example, about 30 μm to about 95 μm. When the polarization film 110 has a thickness with the range, the polarization film 110 is relatively thinner than a polyvinyl alcohol polarizing plate requiring a protective layer such as triacetyl cellulose (TAC), and thus may realize a thin display device.

The first phase delay layer 120a and the second phase delay layer 120b may be, for example, an anisotropic liquid crystal layer including each liquid crystal.

The liquid crystal may have a rigid-rod or wide disk shape that is aligned in one direction, and may be, for example, a monomer, an oligomer, and/or a polymer.

The liquid crystal may be a reactive mesogenic liquid crystal, and may have, for example, at least one reactive cross-linking group. The reactive mesogenic liquid crystal may include at least one of, for example, a rod-shaped aromatic derivative having at least one reactive cross-linking group, propylene glycol 1-methyl, propylene glycol 2-acetate, and a compound represented by P1-A1-(Z1-A2)n-P2 (wherein P1 and P2 independently include acrylate, methacrylate, vinyl, vinyloxy, epoxy, or a combination comprising at least one of the foregoing, A1 and A2 independently include a 1,4-phenylene, naphthalene-2,6-diyl group, or a combination comprising at least one of the foregoing, Z1 includes a single bond, —COO—, —OCO—, or a combination comprising at least one of the foregoing, and n is 0, 1, or 2), but is not limited thereto.

The liquid crystals of the first phase delay layer 120a and the second phase delay layer 120b may independently have positive or negative birefringence (Δn). The birefringence (Δn) is a difference found by subtracting the refractive index ($n_o$) of light propagating perpendicular to an optical axis from the refractive index ($n_e$) of light propagating parallel to the optical axis. The liquid crystal may be aligned in one direction along the optical axis.

For example, the liquid crystals of the first phase delay layer 120a and the second phase delay layer 120b may have respective refractive indices satisfying Relationship Equation 1A or 1B.

$$n_x > n_y = n_z \qquad \text{[Relationship Equation 1A]}$$

$$n_x < n_y = n_z \qquad \text{[Relationship Equation 1B]}$$

In Relationship Equations 1A and 1B, $n_x$ is a refractive index at a slow axis of the first phase delay layer and the second phase delay layer, $n_y$ is a refractive index at a fast axis of the first phase delay layer and the second phase delay layer, and $n_z$ is a refractive index in the direction perpendicular to $n_x$ and $n_y$.

For example, each liquid crystal of the first phase delay layer 120a and the second phase delay layer 120b may have a refractive index satisfying Relationship Equation 1A.

For example, each liquid crystal of the first phase delay layer 120a and the second phase delay layer 120b may have a refractive index satisfying Relationship Equation 1B.

For example, the liquid crystal of the first phase delay layer 120a may have a refractive index satisfying Relationship Equation 1A and the liquid crystal of the second phase delay layer 120b may have a refractive index satisfying Relationship Equation 1B.

For example, the liquid crystal of the first phase delay layer 120a may have a refractive index satisfying Relationship Equation 1B and the liquid crystal of the second phase delay layer 120b may have a refractive index satisfying Relationship Equation 1A.

The first phase delay layer 120a and second phase delay layer 120b may each have forward wavelength dispersion phase delay, and a combination of the first phase delay layer 120a and the second phase delay layer 120b may have an inverse wavelength dispersion phase delay. The forward wavelength dispersion phase delay has higher retardation of light having a short wavelength than retardation of light having a long wavelength, and the reverse wavelength dispersion phase delay has higher retardation of light having a long wavelength than retardation of light having a short wavelength.

The phase delay may be represented by in-phase retardation, in-phase retardation ($R_{e1}$) of the first phase delay layer 120a may be represented by $R_{e1}=(n_{x1}-n_{y1})d_1$, in-phase retardation ($R_{e2}$) of the second phase delay layer 120b may be represented by $R_{e2}=(n_2-n_{y2})d_2$, and the entire in-phase retardation ($R_{e0}$) of the first phase delay layer 120a and the second phase delay layer 120b may be represented by $R_{e0}=(n_{x0}-n_{y0})d_0$. Herein, $n_{x1}$ is a refractive index at a slow axis of the first phase delay layer 120a, $n_{y1}$ is a refractive index at a fast axis of the first phase delay layer 120a, $d_1$ is a thickness of the first phase delay layer 120a, $n_{x2}$ is a refractive index at a slow axis of the second phase delay layer 120b, $n_{y2}$ is a refractive index at a fast axis of the second phase delay layer 120b, $d_2$ is a thickness of the second phase delay layer 120b, $n_{x0}$ is a refractive index at a slow axis of the first phase delay layer 120a and the second phase delay layer 120b, $n_{y0}$ is a refractive index at a fast axis of the first phase delay layer 120a and the second phase delay layer 120b, and $d_0$ is a thickness of the first phase delay layer 120a and the second phase delay layer 120b.

Accordingly, the in-plane retardation ($R_{e1}$ and $R_{e2}$) may be provided within a predetermined range by changing refractive indices at the slow axis and/or the fast axis and/or thicknesses of the first phase delay layer 120a and the second phase delay layer 120b.

For example, in-phase retardation ($R_{e1}$) for a reference wavelength of the first phase delay layer 120a may be about 230 nm to about 300 nm, in-phase retardation ($R_{e2}$) for a reference wavelength of the second phase delay layer 120b may be about 110 nm to about 160 nm, and entire in-phase retardation of the first phase delay layer 120a and the second phase delay layer 120b for incident light having a reference wavelength may be the difference between the in-plane retardation ($R_{e1}$) of the first phase delay layer 120a and the in-plane retardation ($R_{e2}$) of the second phase delay layer 120b. For example, the entire in-phase retardation ($R_{e0}$) of the first phase delay layer 120a and the second phase delay layer 120b for incident light of a reference wavelength may be about 110 nm to about 160 nm.

In the first phase delay layer 120a and the second phase delay layer 120b, the retardation of light having a short wavelength may be higher than the retardation of light having a long wavelength as described above. For example, for the wavelengths of 450 nm, 550 nm, and 650 nm, the in-plane retardation ($R_{e1}$) of the first phase delay layer 120a may satisfy $R_{e1}$ (450 nm)≥$R_{e1}$ (550 nm)>$R_{e1}$ (650 nm) or $R_{e1}$ (450 nm)>$R_{e1}$ (550 nm)≥$R_{e1}$ (650 nm), and the in-plane retardation ($R_{e2}$) of the second phase delay layer 120b may satisfy $R_{e2}$ (450 nm)>$R_{e2}$ (550 nm)>$R_{e2}$ (650 nm).

The combination of the first phase delay layer 120a and the second phase delay layer 120b may have higher retardation of light having a long wavelength than the retardation of light having a short wavelength as described above. For example, the in-phase retardation ($R_{e0}$) of the first phase delay layer 120a and the second phase delay layer 120b at 450 nm, 550 nm, and 650 nm wavelengths may satisfy $R_{e0}$ (450 nm)≤$R_{e0}$ (550 nm)<$R_{e0}$ (650 nm) or $R_{e0}$ (450 nm)<$R_{e0}$ (550 nm)≤$R_{e0}$ (650 nm).

The changing of the retardation of the short wavelength for the reference wavelength may be represented by short wavelength dispersion, the short wavelength dispersion of the first phase delay layer 120a may be represented by $R_{e1}$ (450 nm)/$R_{e1}$ (550 nm), and the short wavelength dispersion of the second phase delay layer 120b may be represented by $R_{e2}$ (450 nm)/$R_{e2}$ (550 nm). For example, the short wavelength dispersion of the first phase delay layer 120a and the second phase delay layer 120b may independently be about 1.1 to about 1.2, and the entire short wavelength dispersion of the first phase delay layer 120a and the second phase delay layer 120b may be about 0.70 to about 0.99.

The changing of the retardation of the long wavelength for the reference wavelength may be represented by long wavelength dispersion, the long wavelength dispersion of the first phase delay layer 120a may be represented by $R_{e1}$ (650 nm)/$R_{e1}$ (550 nm), and the long wavelength dispersion of the second phase delay layer 120b may be represented by $R_{e2}$ (650 nm)/$R_{e2}$ (550 nm). For example, the long wavelength dispersion of the first phase delay layer 120a and the second phase delay layer 120b may independently be about 0.9 to about 1.0, and the entire long wavelength dispersion of the first phase delay layer 120a and the second phase delay layer 120b may be about 1.01 to about 1.20.

On the other hand, the thickness direction retardation ($R_{th1}$) of the first phase delay layer 120a may be represented by $R_{th1}=\{[(n_{x1}+n_{y1})/2]-n_{z1}\}d_1$, the thickness direction retardation ($R_{th2}$) of the second phase delay layer 120b may be represented by $R_{th2}=\{[(n_{x2}+n_{y2})/2]-n_{z2}\}d_2$, and the thickness direction retardation ($R_{th0}$) of the combined first phase delay layer 120a and the second phase delay layer 120b may be represented by $R_{th0}=\{[(n_{x0}+n_{y0})/2]-n_{z0}\}d_0$. Herein, $n_{x1}$ is a refractive index at a slow axis of the first phase delay layer 120a, $n_{y1}$ is a refractive index at a fast axis of the first phase delay layer 120a, $n_{z1}$ is a refractive index in a direction perpendicular to $n_{x1}$ and $n_{y1}$, $n_{x2}$ is a refractive index at a slow axis of the second phase delay layer 120b, $n_{y2}$ is a refractive index at a fast axis of the second phase delay layer 120b, $n_{z2}$ is a refractive index in a direction perpendicular to $n_{x2}$ and $n_{y2}$, $n_{x0}$ is a refractive index at a slow axis of the combined first and second phase delay layer 120a and 120b, $n_{y0}$ is a refractive index at a fast axis of the combined first and second phase delay layers 120a and 120b, and $n_{z0}$ is a refractive index in a direction perpendicular to $n_{x0}$ and $n_{y0}$.

The thickness direction retardation ($R_{th0}$) of the first phase delay layer 120a and the second phase delay layer 120b may be the sum of the thickness direction retardation ($R_{th1}$) of the first phase delay layer 120a and the thickness direction retardation ($R_{th2}$) of the second phase delay layer 120b. For example, the thickness direction retardation ($R_{th0}$) of the first phase delay layer 120a and the second phase delay layer 120b for a reference wavelength may be about −250 nm to about 250 nm.

The first phase delay layer 120a and the second phase delay layer 120b may each have a thickness of less than or equal to about 5 μm. For example, the first phase delay layer 120a and the second phase delay layer 120b may each have a thickness of about 0.5 μm to about 5 μm. For example, the sum of the thicknesses of the first phase delay layer 120a and the second phase delay layer 120b may be about 1 µm to about 10 µm, for example about 2 µm to about 8 µm.

In this way, the first phase delay layer 120a and the second phase delay layer 120b may have remarkably reduced thickness compared with a conventional polymer phase delay layer, and thereby may reduce the thickness of the optical film 300. Accordingly, a display device including the optical film 300 may also have a reduced thickness and a thin display device may be realized.

Each of the first phase delay layer 120a and the second phase delay layer 120b may be thinner than the first and second adhesives 115a and 115b which will be described later.

The first phase delay layer 120a and the second phase delay layer 120b may be formed by applying a liquid crystal solution on a substrate. Herein, the first phase delay layer 120a and the second phase delay layer 120b may be formed on respective substrates or may be sequentially formed on one substrate. The substrate may be, for example, a triacetyl cellulose (TAC) film, but is not limited thereto. The liquid crystal solution may include a liquid crystal and a solvent such as toluene, xylene, cyclohexanone, and the like, and the solution may be, for example, applied on the transparent substrate with a solution process such as spin coating, bar coating, slit coating, or inkjet coating. Subsequently, the liquid crystal solution may be further dried, and for example, the liquid crystal is cured with UV.

The first phase delay layer 120a and the second phase delay layer 120b having controlled optical properties are respectively prepared, and are assembled to realize a reverse wavelength dispersion delay and to show λ/4 retardation in a full visible ray region. Accordingly, the first phase delay layer 120a and the second phase delay layer 120b may effectively realize a compensation function of circularly polarized light and form an optical film with the polarization film 110 to improve display characteristics of a display device.

The polarization film 110 and the first phase delay layer 120a, and the first phase delay layer 120a and the second phase delay layer 120b, may be bound with each other by intervening the first and second adhesives 115a and 115b. The first and second adhesives 115a and 115b may be, for example, a pressure sensitive adhesive (PSA).

The first and second adhesives 115a and 115b may be a composition including an adhesive resin or a cured product thereof.

The adhesive resin may include, for example a (meth) acrylic resin, a urethane resin, a polyisobutylene resin, a styrene butadiene rubber, a polyvinylether resin, an epoxy resin, a melamine resin, a polyester resin, a phenolic resin, a silicone resin, a derivative thereof, a copolymer thereof, or a combination comprising at least one of the foregoing, but is not limited thereto.

The adhesive resin may be, for example, synthesized from at least one monomer and/or oligomer, a reaction initiator, and a cross-linking agent. The monomer and/or oligomer may include, for example, alkyl(meth)acrylate, but is not limited thereto. The reaction initiator may be, for example, benzoyl peroxide, acetyl peroxide, dilauroyl peroxide, hydrogen peroxide, potassium persulfonate, 2,2'-azobisisobutyronitrile (AIBN), or a combination comprising at least one of the foregoing, but is not limited thereto. The cross-linking agent may be, for example, an isocyanate compound, an epoxy compound, an aziridine compound, a metal chelate compound, or a combination comprising at least one of the foregoing, but is not limited thereto.

The adhesive resin may have, for example, a hydroxy group, a carboxyl group, a nitrogen-containing functional group, or a combination comprising at least one of the foregoing.

The adhesive resin may have, for example, a weight average molecular weight (Mw) of about 500,000 to about 1,800,000, for example about 600,000 to 1,500,000.

The first and second adhesives 115a and 115b may each have, for example, a thickness of about 5 µm to about 25 µm. The first and second adhesives 115a and 115b may each have, for example, a thickness of about 5 µm to about 12 µm.

The first and/or second adhesives 115a and 115b have a storage modulus of greater than or equal to about 0.2 MPa at room temperature (25° C.) of at a frequency of 10 Hz.

As described above, the first phase delay layer 120a and the second phase delay layer 120b may have an ultrathin thickness of about 0.5 µm to about 5 µm. Each thickness of the first phase delay layer 120a and the second phase delay layer 120b may be smaller than the thickness of the first or second adhesives 115a and 115b, and for example, each thickness of the first phase delay layer 120a and the second phase delay layer 120b may be about 0.05 to about 0.8 times a thickness of the first or second adhesives 115a and 115b.

Durability of the thin first and second phase delay layers 120a and 120b is improved by adjusting the storage modulus of the first and/or second adhesives 115a and 115b contacting the first and/or second phase delay layers 120a and 120b. In other words, when the first and/or second adhesives 115a and 115b have a storage modulus of greater than or equal to about 0.2 MPa, the thin first and/or second phase delay layers 120a and 120b are less likely to crack and/or a wrinkle.

Furthermore, when the first and/or second adhesives 115a and 115b have a storage modulus of greater than or equal to about 0.2 MPa, the first and/or second phase delay layers 120a and 120b are much less likely to crack and/or a wrinkle where the optical film 300 is bent or folded. Accordingly, since the external deformation of the optical film 300 may be reduced, the optical film may be effectively applied to a flexible display device such as a foldable or bendable display device and improve characteristics of a display device including the optical film 300.

The storage modulus of the first and/or second adhesives 115a and 115b may be about 0.2 MPa to about 8 GPa, or about 0.7 MPa to about 8 GPa.

The first and/or second adhesives 115a and 115b may have a 180° peel force of greater than or equal to about 1500 gf/25 mm at room temperature for the first phase delay layer 120a or the second phase delay layer 120b. Herein, the 180° peel force is an index for evaluating adherence between the first or second phase delay layer 120a or 120b and the first and/or second adhesives 115a and/or 115b and is determined after folding a polymer film up to 180° after curing a sample sequentially consisting of the first or second phase delay layer 120a or 120b, the first and/or second adhesive 115a and/or 115b, and the polymer film. The 90° peel force may be about 1500 gf/25 mm to about 5000 gf/25 mm.

The optical film 300 may further include a correction layer (not shown). The correction layer may be, for example, a color shift resistant layer, but is not limited thereto.

The optical film 300 may further include a light-blocking layer (not shown) spreading out along the edge. The light-blocking layer may be formed as a band along the circumference of the optical film 300, for example, positioned between the polarization film 110 and the first phase delay layer 120a. The light-blocking layer may include an opaque material, for example, a black material. For example, the light-blocking layer may be made of a black ink.

As described above, the optical film 300 according to the present embodiment may accomplish the reverse wavelength dispersion delay by assembling the first phase delay layer 120a and the second phase delay layer 120b having controlled optical properties, and may provide λ/4 retardation in the entire visible ray region. Accordingly, the first and second phase delay layers 120a and 120b may effectively accomplish the circularly polarized compensation function and may improve the display characteristics of the display device by forming an optical film with the polarization film 110.

In addition, the optical film 300 may become much thinner by using the thin first and second phase delay layers 120a and 120b. Accordingly, the optical film 300 is applied to realize a thin display device.

In addition, the storage modulus of the first and/or second adhesives 115a and/or 115b contacting the first and/or second phase delay layers 120a and/or 120b may be adjusted to reduce generation of a crack or a wrinkle in the first and second phase delay layers 120a and 120b and secure durability. Accordingly, the optical film 300 may improve characteristics of a display device.

In addition, the first and second phase delay layers 120a and 120b secure durability, have much less cracks or wrinkles where the optical film 300 is folded or bent, and accordingly, the optical film 300 may be effectively applied to a flexible display device such as a foldable display device or a bendable display device.

The optical film 300 may be applied to various display devices.

A display device includes a display panel and an optical film positioned on one side of the display panel. The display panel may be a liquid crystal panel or organic light emitting panel, but is not limited thereto.

Hereinafter, an organic light emitting display is described as one example of a display device.

Figure 4:
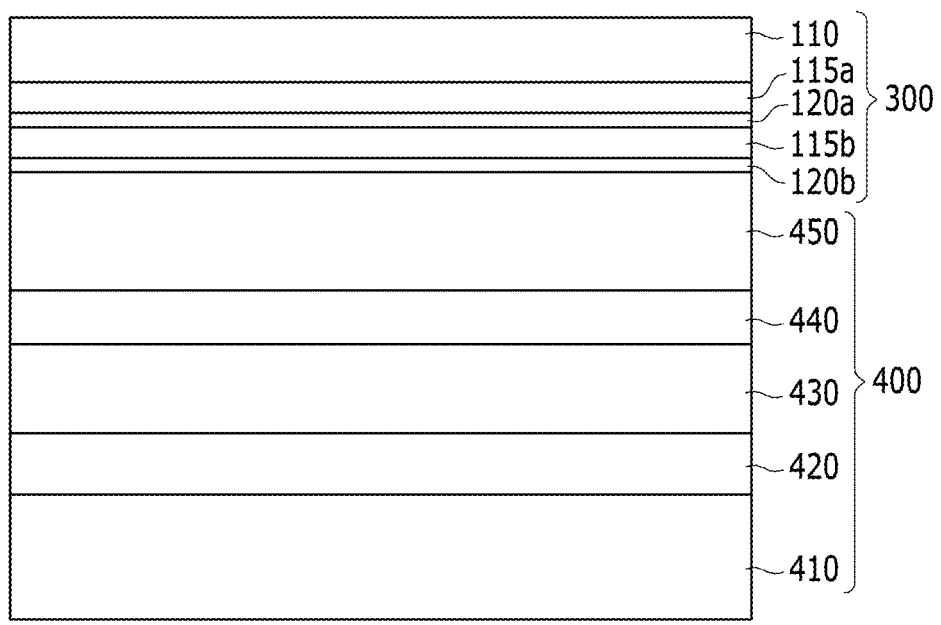
FIG. 4 is a schematic cross-sectional view showing an exemplary embodiment of an organic light emitting diode (OLED)

FIG. 4 is a cross-sectional view showing an exemplary example of an organic light emitting display.

Referring to FIG. 4, the organic light emitting display includes an organic light emitting display panel 400 and an optical film 300 positioned on one side of the organic light emitting display panel 400.

The organic light emitting display panel 400 may include a base substrate 410, a lower electrode 420, an organic emission layer 430, an upper electrode 440, and an encapsulation substrate 450.

The base substrate 410 may be made of glass or plastic.

At least one of the lower electrode 420 and the upper electrode 440 may be an anode, and the other one may be a cathode. The anode is an electrode injected with holes, and may be made of a transparent conductive material having a high work function to transmit the emitted light to the outside, for example, indium tin oxide (ITO) or indium zinc oxide (IZO). The cathode is an electrode injected with electrons, and may be made of a conductive material having a low work function and not affecting the organic material, and may be selected from, for example, aluminum (Al), calcium (Ca), and barium (Ba).

The organic emission layer 430 includes an organic material which may emit light when applying a voltage to the lower electrode 420 and the upper electrode 440.

An auxiliary layer (not shown) may be further provided between the lower electrode 420 and the organic emission layer 430 and between the upper electrode 440 and the organic emission layer 430. The auxiliary layer is used to balance electrons and holes, and may include a hole transport layer, a hole injection layer (HIL), an electron injection layer (EIL), and an electron transporting layer.

The encapsulation substrate 450 may be made of glass, metal, or a polymer, and may seal the lower electrode 420, the organic emission layer 430, and the upper electrode 440 to prevent moisture and/or oxygen inflow from the outside.

The organic light emitting display panel 400 may be a flexible display panel.

The optical film 300 may be disposed on the light-emitting side. For example, in the case of a bottom emission structure emitting light at the side of the base substrate 410, the optical film 100 may be disposed on the exterior side of the base substrate 410, while in the case of a top emission structure emitting light at the side of the encapsulation substrate 450, the optical film 100 may be disposed on the exterior side of the encapsulation substrate 450.

As described above, the optical film 300 includes the polarization film 110 that is self-integrated and formed of a melt blend of a polyolefin and a dichroic dye, the first and second phase delay layers 120a and 120b that are liquid crystal anisotropic layers, and the first and second adhesives 115a and 115b. The polarization film 110, the first and second phase delay layers 120a and 120b, and the first and second adhesive 115a and 115b are respectively the same as described above, and may prevent a display device from having visibility deterioration caused by light inflowing from the outside after passing the polarization film 110 and being reflected by a metal such as an electrode and the like in the organic light emitting display panel 400. Accordingly, display characteristics of the organic light emitting display may be improved.

Hereinafter, a liquid crystal display (LCD) is described as an exemplary example of the display device.

Figure 5:
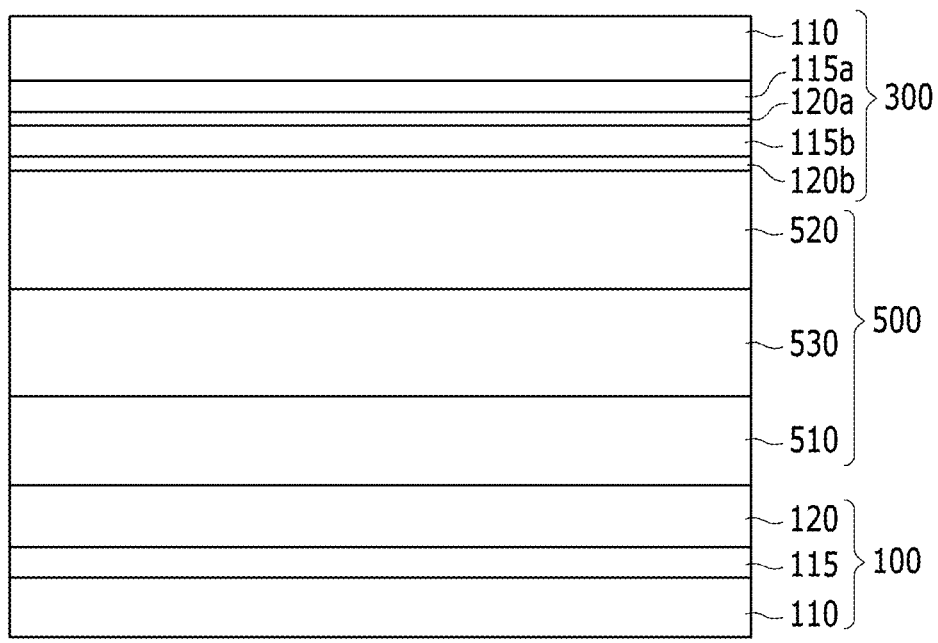
FIG. 5 is a schematic cross-sectional view showing an exemplary embodiment of a liquid crystal display (LCD) device.

FIG. 5 is a schematic cross-sectional view showing an exemplary liquid crystal display.

Referring to FIG. 5, the liquid crystal display (LCD) includes a liquid crystal display panel 500, and an optical film 100 positioned on one side of the liquid crystal panel 500.

The liquid crystal panel 500 may be a twist nematic (TN) mode panel, a vertical alignment (PVA) mode panel, an in-plane switching (IPS) mode panel, an optically compensated bend (OCB) mode panel, or the like.

The liquid crystal panel 500 may include a first display panel 510, a second display panel 520, and a liquid crystal layer 530 interposed between the first display panel 510 and the second display panel 520.

The first display panel 510 may include, for example, a thin film transistor (not shown) formed on a substrate (not shown) and a first electric field generating electrode (not shown) connected to the same, and the second display panel 520 may include, for example, a color filter (not shown) formed on a substrate (not shown) and a second electric field generating electrode (not shown). However, it is not limited thereto, and the color filter may be included in the first display panel 510, while the first electric field generating electrode and the second electric field generating electrode may be disposed on the first display panel 510 together therewith.

The liquid crystal layer 530 may include a plurality of liquid crystal molecules. The liquid crystal molecules may have positive or negative dielectric anisotropy. In the case of the liquid crystal molecules having positive dielectric anisotropy, the major axes thereof may be aligned substantially parallel to the surface of the first display panel 510 and the second display panel 520 when not applying an electric field, and the major axes may be aligned substantially perpendicular to the surface of the first display panel 510 and second display panel 520 when applying an electric field. On the other hand, in the case of the liquid crystal molecules having negative dielectric anisotropy, the major axes may be aligned substantially perpendicular to the surface of the first display panel 510 and the second display panel 520 when not applying an electric field, and the major axes may be aligned substantially parallel to the surface of the first display panel 510 and the second display panel 520 when applying an electric field.

The liquid crystal panel 500 may be a flexible display panel.

The optical film 300 includes the polarization film 110 that is self-integrated and formed of a melt blend of a polyolefin and a dichroic dye, the first and second phase delay layers 120a and 120b that are liquid crystal anisotropic layers, and the first and second adhesives 115a and 115b, which are the same as described above.

The optical film 300 may be disposed on the outside of the liquid crystal panel 500. Although the optical film 100 is shown to be provided on both the lower part and the upper part of the liquid crystal panel 500 in the drawing, it is not limited thereto, and it may be formed on only one of the lower part and the upper part of the liquid crystal panel 500.

Hereinafter, the present disclosure is illustrated in more detail with reference to examples. However, these examples are exemplary, and the present disclosure is not limited thereto.

Manufacture of Polarization Film

Preparation Example 1

A composition for a polarization film is prepared by mixing a polyolefin including polypropylene (PP) (HU300, Samsung Total Petrochemicals Co., Ltd.) and a polypropylene-polyethylene copolymer (PP-PE) (RJ581, Samsung Total Petrochemicals Co., Ltd.) in a ratio of 5:5 (w/w) and dichroic dyes represented by the following Chemical Formulas A, B, and C in an amount of 0.5, 0.2, and 0.3 parts by weight based on 100 parts by weight of the polyolefin respectively.

The composition for a polarization film is melt-blended at about 250° C. by using a micro-compounder made by DSM. The melt mixture is put in a sheet-shaped mold and pressed with high temperature and pressure, forming a film. Subsequently, the film is elongated by 1000% (with a tensile tester made by Instron) in a uniaxial direction at 115° C., obtaining a 20 micrometer (μm)-thick polarization film.

Formation of Phase Delay Layer

Preparation Example 2

A 100 μm-thick PET film is photo-aligned for an LC alignment treatment in one direction, and liquid crystals (MR2, Dai Nippon Printing Co., Ltd.) are coated thereon and dried at 60° C. for 1 min in an oven to remove a solvent therein. Subsequently, the liquid crystals are optically cross-linked by radiating ultraviolet (UV) with intensity of 80 milliwatts per square centimeter (mW/cm$^2$) for 30 second (s) in a container charged with nitrogen, forming a λ/2 phase delay layer having optical properties shown in Table 1.

Preparation Example 3

A 100 μm-thick PET film is photo-aligned for an LC alignment treatment in one direction, and liquid crystals (MR4, Dai Nippon Printing Co., Ltd.) are coated thereon and dried at 60° C. for 1 min in an oven to remove a solvent therein. Subsequently, liquid crystals are optically cross-linked by radiating ultraviolet (UV) with intensity of 80 mW/cm$^2$ for 30 s in a container charged with nitrogen, forming a λ/4 phase delay layer having optical properties shown in Table 1.

TABLE 1

| | In-phase retardation | Wavelength dispersion | | Thickness direction phase difference | Thickness |
|---|---|---|---|---|---|
| | ($R_e$) $R_e$ (550 nm) | $R_e$ (450 nm)/ $R_e$ (550 nm) | $R_e$ (650 nm)/ $R_e$ (550 nm) | ($R_{th}$) | (μm) |
| λ/2 | 240 | 1.16 | 0.97 | 110 | 2 |
| λ/4 | 120 | 1.12 | 0.99 | 57 | 1 |
| λ/2 + λ/4 | 134 | 0.78 | 1.06 | 167 | 3 |

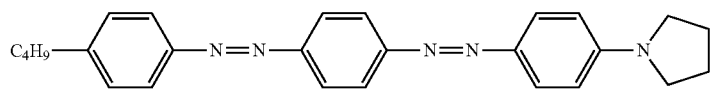

[Chemical Formula A]

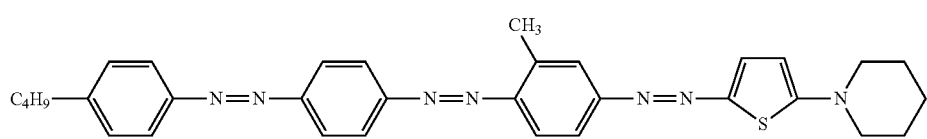

[Chemical Formula B]

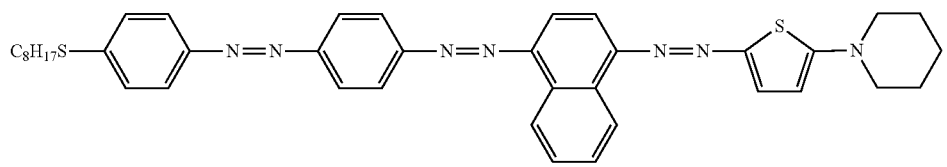

[Chemical Formula C]

Preparation of Adhesive

Preparation Example 4

95 parts by weight of acrylic acid 2-ethyl hexyl, 5 parts by weight of acrylic acid, and 350 parts by weight of acetone are put in a 3-necked flask equipped with a cooler, an agitator, and a thermometer, and nitrogen. This polymerization flask is heated at 80° C. while the solution is agitated under a nitrogen atmosphere, 0.05 parts by weight of 2,2'-azobisisobutyronitrile is added thereto, and the mixture is reacted for 2 hours (h). Subsequently, 0.05 parts by weight of 2,2'-azobisisobutyronitrile is further added thereto, and the obtained mixture is reacted for 5 h. When the reaction is complete, the polymerization flask is cooled down, and 100 parts by weight of acetic acid ethyl is added thereto, obtaining an acryl polymer solution. The acryl polymer in the solution has a weight average molecular weight of about 800,000.

Then, 10 parts by weight, based on the weight of solids in the acryl polymer solution, of modified polyisocyanate (a hardener, Toyoink) is added.

Preparation Example 5

An adhesive is prepared according to the same method as Preparation Example 4, except for using 13 parts by weight, based on the weight of solids in the acryl polymer solution, of the modified polyisocyanate.

Preparation Example 6

An adhesive is prepared according to the same method as Preparation Example 4, except for using 15 parts by weight, based on the weight of solids in the acryl polymer solution, of the modified polyisocyanate.

Preparation Example 7

An adhesive is prepared according to the same method as Preparation Example 4, except for using 20 parts by weight, based on the weight of solids in the acryl polymer solution, of the modified polyisocyanate.

Preparation Example 8

An adhesive is prepared according to the same method as Preparation Example 4, except for using 0.2 parts by weight, based on the weight of solids in the acryl polymer solution, of the modified polyisocyanate.

Preparation Example 9

An adhesive is prepared according to the same method as Preparation Example 4, except for using 5 parts by weight, based on the weight of solids in the acryl polymer solution, of the modified polyisocyanate.

Evaluation 1: Storage Modulus of Adhesive

Storage modulus of the adhesives according to Preparation Examples 4 to 9 is measured.

The adhesives are respectively coated to be 10 μm thick after drying on a 38 μm thick polyester film and heat-treated at 105° C. for 5 min, forming each adhesive film. Subsequently, storage modulus of the adhesives is measured by overlapping several adhesive films to prepare a 500 μm-thick sample, cutting the sample into a disk specimen having a diameter of 8 mm, and using a storage modulus meter (Anton Paar Inc.) at 25° C. under a frequency of 10 Hz.

The results are provided in Table 2.

TABLE 2

| | Storage modulus (MPa, 25° C.) |
|---|---|
| Preparation Example 4 | 0.28 |
| Preparation Example 5 | 0.72 |
| Preparation Example 6 | 0.79 |
| Preparation Example 7 | 1.60 |
| Preparation Example 8 | 0.065 |
| Preparation Example 9 | 0.12 |

Preparation of Sample for Peel Force Evaluation of Curing Adhesive

Example 1

A 7 μm-thick adhesive film is prepared by coating the adhesive according to Preparation Example 4 to be 10 μm thick on the λ/2 phase delay layer according to Preparation Example 2 and heat-treating it at 105° C. for 5 min. Then, a 100 μm-thick polyethylene terephthalate (PET) film is attached to the adhesive film, preparing a sample.

Example 2

A sample is prepared according to the same method as Example 1, except for using the adhesive of Preparation Example 5 instead of the adhesive of Preparation Example 4.

Example 3

A sample is prepared according to the same method as Example 1, except for using the adhesive of Preparation Example 6 instead of the adhesive of Preparation Example 4.

Example 4

A sample is prepared according to the same method as Example 1, except for using the adhesive of Preparation Example 7 instead of the adhesive of Preparation Example 4.

Evaluation 2: Peel Force Evaluation of Adhesive

Each sample according to Examples 1 to 4 is cut into a size of 25 millimeters (mm)×200 mm and folded to 180° to peel off the polyethylene terephthalate (PET) film and evaluate the peel force of a λ/2 phase delay layer and an adhesive with a texture analyzer.

The results are provided in Table 3.

TABLE 3

| | Peel force (gf/25 mm, 25° C.) |
|---|---|
| Example 1 | 2650 |
| Example 2 | 1530 |
| Example 3 | 2550 |
| Example 4 | 2520 |

Referring to Table 3, the samples according to Examples 1 to 4 show a satisfactory peel force, and turn out to have a room temperature peel force of greater than or equal to about 1500 gf/25 mm.

Manufacture of Optical Film

Example 5

The adhesive of Preparation Example 8 is coated to be 7 μm thick on one side of the polarization film of Preparation Example 1, and the λ/2 phase delay layer of Preparation Example 2 is disposed to face the polarization film. Subsequently, the λ/2 phase delay layer is transferred onto the adhesive, while a PET film is removed, manufacturing an optical film. Subsequently, the adhesive of Preparation Example 5 is coated to be 7 μm thick on one side of the λ/2 phase delay layer. On the adhesive, the λ/4 phase delay layer of Preparation Example 3 is disposed to face it and transferred while a PET film is removed, manufacturing an optical film. The polarization film has an optical axis of 0°, the λ/2 phase delay layer has a slow axis of 15°, the λ/4 phase delay layer has a slow axis of 75°, and the optical film has a thickness of about 40 μm.

Example 6

An optical film is manufactured according to the same method as Example 5, except for using the adhesive of Preparation Example 6 instead of the adhesive of Preparation Example 5.

Example 7

An optical film is manufactured according to the same method as Example 5, except for using the adhesive of Preparation Example 8 instead of the adhesive of Preparation Example 5.

Comparative Example 1

An optical film is manufactured according to the same method as Example 5, except for using the adhesive of Preparation Example 8 instead of the adhesive of Preparation Example 5.

Evaluation 3: High Temperature Durability 1

High temperature durability of the optical films according to Examples 5 to 7 and Comparative Example 1 is evaluated.

The high temperature durability is evaluated by examining whether a place where the optical films are folded is deformed and/or damaged in a static bending test. The static bending test is performed by folding each optical film according to Examples 5 to 7 and Comparative Example 1 to have a curvature radius (r) of 3 mm, fixing it between two stainless steel plates, allowing it to stand at 85° C. for 240 h, and unfolding it to examine whether the folded place is deformed or not.

The results are provided in FIGS. 6 to 9.

Figure 6:
FIG. 6 is a photograph showing the appearance of an optical film according to Example 5 attached to a reflector after performing a bending test.
Figure 7:
FIG. 7 is a photograph showing the appearance of an optical film according to Example 6 attached to a reflector after performing a bending test.
Figure 8:
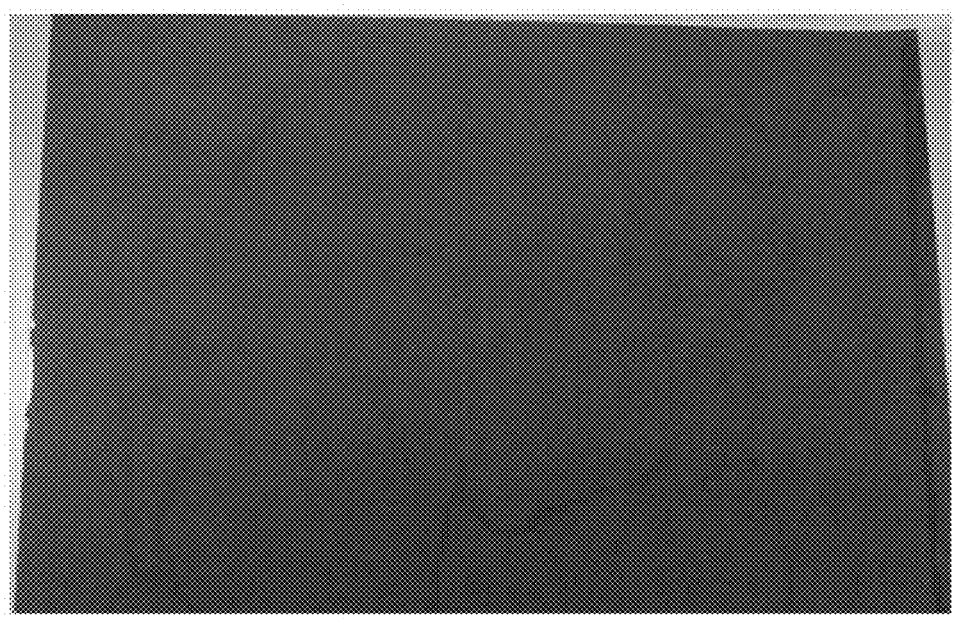
FIG. 8 is a photograph showing the appearance of an optical film according to Example 7 attached to a reflector after performing a bending test.
Figure 9:
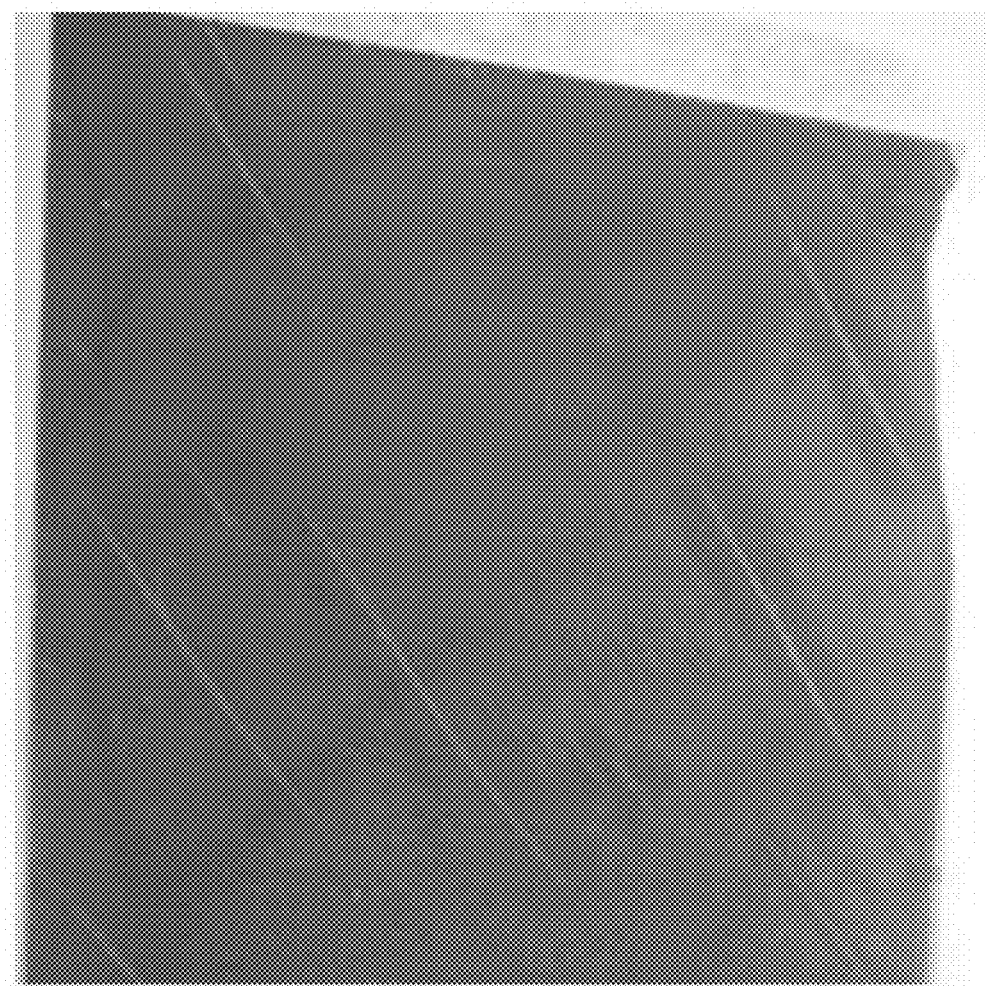
FIG. 9 is a photograph showing the appearance of an optical film according to Comparative Example 1 attached to a reflector after performing a bending test.

FIG. 6 is a photograph showing the appearance of the optical film of Example 5 attached to a reflector after performing a bending test. FIG. 7 is a photograph showing the appearance of the optical film of Example 6 attached to a reflector after performing a bending test. FIG. 8 is a photograph showing the appearance of the optical film of Example 7 attached to a reflector after performing a bending test. FIG. 9 is a photograph showing the appearance of the optical film of Comparative Example 1 attached to a reflector after performing a bending test.

Referring to FIGS. 6 to 9, the optical films according to Examples 5 to 7 show no crack or wrinkle in the folded place, while the optical film according to Comparative Example 1 show many cracks and wrinkles along a diagonal line in the folded place.

Accordingly, the optical films according to Examples 5 to 7 show satisfactory high temperature durability without appearance deformation.

Evaluation 4: High Temperature Durability 2

The phase difference change of the optical films according to Example 5 and Comparative Example 1 is examined after the above static bending test.

The initial phase difference of the optical films before the static bending test and their phase difference after the static bending test are measured by using optical measurement equipment (KOBRA) to obtain their phase difference changes.

The results are provided in Table 4.

TABLE 4

|  | Phase difference change |
| --- | --- |
| Example 5 | 1.90 |
| Comparative Example 1 | 2.60 |

Referring to Table 4, the optical film according to Example 5 has a phase difference change of less than 2.0, while the optical film according to Comparative Example 1 has a large phase difference change of greater than or equal to 2.5 at the folded place. Specifically, the optical film of Example 5 shows a phase difference change of about 30% compared with the optical film according to Comparative Example 1.

Accordingly, the optical film of Example 5 has a small optical property change and thus has satisfactory high temperature durability.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An optical film comprising:
a polarization film comprising a polyolefin and a dichroic dye;
a first phase delay layer positioned on the polarization film and comprising a liquid crystal;
a second phase delay layer positioned on the first phase delay layer and comprising a liquid crystal;
a first adhesive between the polarization film and the first phase delay layer; and
a second adhesive between the first phase delay layer and the second phase delay layer,
wherein at least one of the first adhesive and the second adhesive has a room temperature storage modulus of greater than or equal to about 0.2 MPa at a frequency of 10 Hz, and
wherein the first phase delay layer and the second phase delay layer are thinner than the first adhesive or the second adhesive, respectively, each thickness of the first phase delay layer and the second phase delay layer is about 0.5 μm to about 5 μm, and each thickness of the first adhesive and the second adhesive is about 5 μm to about 12 μm wherein one of the first phase delay layer and the second phase delay layer has in-phase retardation of about 230 nm to about 300 nm for a 550 nm wavelength, and the of the of the first phase delay layer and the second phase delay layer has in-phase retardation of about 110 nm to about 160 nm for a 550 nm wavelength, wherein in-phase retardation ($R_{e1}$) of the first phase delay layer for 450 nm, 550 nm, and 650 nm wavelengths satisfies $R_{e1}$ (450 nm)>$R_{e1}$ (550 nm)>$R_{e1}$ (650 nm), in-phase retardation ($R_{e2}$) of the second phase delay layer for 450 nm, 550 nm, and 650 nm wavelengths satisfies $R_{e2}$ (450 nm)>$R_{e2}$ (550 nm)>$R_{e2}$ (650 nm), and entire in-phase retardation ($R_{e0}$) of the first phase delay layer and the second phase delay layer for 450 nm, 550 nm, and 650 nm wavelengths satisfies $R_{e0}$ (450 nm)<$R_{e0}$ (550 nm)<$R_{e0}$ (650 nm) or $R_{e0}$ (450 nm)<$R_{e0}$ (550 nm)<$R_{e0}$ (650 nm).

2. The optical film of claim 1, wherein the adhesive comprises a (meth)acryl compound, a urethane compound, a polyisobutylene compound, a styrene butadiene rubber, a polyvinylether compound, an epoxy compound, a melamine compound, a polyester compound, a phenol compound, a silicon compound, a derivative thereof, a copolymer thereof, or a combination comprising at least one of the foregoing.

3. The optical film of claim 1, wherein the adhesive comprises a resin having a hydroxy group, a carboxyl group, a nitrogen-containing functional group, or a combination comprising at least one of the foregoing.

4. The optical film of claim 1, wherein the adhesive comprises a cross-linked resin cross-linked by a cross-linking agent of an isocyanate compound, an epoxy compound, an aziridine compound, a metal chelate compound, or a combination comprising at least one of the foregoing.

5. The optical film of claim 1, wherein each thickness of the first phase delay layer and the second phase delay layer is about 0.05 to about 0.8 times of a thickness of the first adhesive or the second adhesive.

6. The optical film of claim 1, wherein the sum of the thicknesses of the first phase delay layer and the second phase delay layer is about 1 μm to about 10 μm.

7. The optical film of claim 1, wherein at least one of the first adhesive and the second adhesive has a room temperature storage modulus of about 0.2 MPa to about 8 GPa at a frequency of 10 Hz.

8. The optical film of claim 1, wherein at least one of the first adhesive and the second adhesive has a 180° peel force of greater than or equal to about 1500 gf/25 mm at room temperature for the first phase delay layer or the second phase delay layer.

9. The optical film of claim 1, wherein the liquid crystal of the first phase delay layer and the liquid crystal of the second phase delay layer have respective refractive indices satisfying Relationship Equation 1A or 1B:

$$n_x > n_y = n_z \quad \text{[Relationship Equation 1A]}$$

$$n_x < n_y = n_z \quad \text{[Relationship Equation 1B]}$$

wherein, in Relationship Equations 1A and 1B, $n_x$ is a refractive index at a slow axis of the first phase delay layer and the second phase delay layer, $n_y$ is a refractive index at a fast axis of the first phase delay layer and the second phase delay layer, and $n_z$ is a refractive index in the direction perpendicular to $n_x$ and $n_y$.

10. The optical film of claim 1, wherein the first phase delay layer and the second phase delay layer respectively have short wavelength dispersion of about 1.1 to about 1.2, and the first phase delay layer and the second phase delay layer have entire short wavelength dispersion of about 0.70 to about 0.99.

11. The optical film of claim 1, wherein the first phase delay layer and the second phase delay layer respectively have long wavelength dispersion of about 0.9 to about 1.0, and the first phase delay layer and the second phase delay layer have entire long wavelength dispersion of about 1.01 to about 1.20.

12. The optical film of claim 1, wherein the polarization film has a thickness of less than or equal to about 100 μm.

13. A display device comprising a display panel, and the optical film of claim 1 positioned on at least one side the display panel.

14. The display device of claim 13, wherein the display panel is a liquid crystal panel or an organic light emitting panel.

15. The display device of claim 13, wherein the display panel is a flexible display panel.

* * * * *